US009337085B2

(12) United States Patent
Sel et al.

(10) Patent No.: US 9,337,085 B2
(45) Date of Patent: May 10, 2016

(54) AIR GAP FORMATION BETWEEN BIT LINES WITH SIDE PROTECTION

(71) Applicant: SanDisk Technologies Inc., Plano, TX (US)

(72) Inventors: Jong Sun Sel, Los Gatos, CA (US); Marika Gunji-Yoneoka, Sunnyvale, CA (US); Naoki Takeguchi, Aichiken (JP); Chan Park, Aichiken (JP); Tuan D. Pham, San Jose, CA (US); Kazuya Tokunaga, San Francisco, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/340,953

(22) Filed: Jul. 25, 2014

(65) Prior Publication Data

US 2015/0228582 A1 Aug. 13, 2015

Related U.S. Application Data

(60) Provisional application No. 61/939,095, filed on Feb. 12, 2014.

(51) Int. Cl.
*H01L 23/532* (2006.01)
*H01L 27/115* (2006.01)
*H01L 21/768* (2006.01)
*H01L 23/522* (2006.01)

(52) U.S. Cl.
CPC ...... *H01L 21/7682* (2013.01); *H01L 21/76802* (2013.01); *H01L 21/76879* (2013.01); *H01L 23/5222* (2013.01); *H01L 23/53228* (2013.01); *H01L 23/53257* (2013.01); *H01L 23/53295* (2013.01); *H01L 27/11529* (2013.01); *H01L 23/53238* (2013.01); *H01L 23/53266* (2013.01)

(58) Field of Classification Search
CPC ............... H01L 21/76832; H01L 27/10885; H01L 21/7682; H01L 21/76822; H01L 21/764; H01L 23/481; H01L 23/4821; H01L 27/11529; H01L 21/76802; H01L 21/76879; H01L 23/53257; H01L 23/5222; H01L 23/53295; H01L 23/53228; H01L 23/53266; H01L 23/53238
See application file for complete search history.

(56) References Cited

U.S. PATENT DOCUMENTS

| 5,570,315 | A | 10/1996 | Tanaka et al. |
| 5,774,397 | A | 6/1998 | Endoh et al. |
| 5,887,145 | A | 3/1999 | Harari et al. |
| 6,046,935 | A | 4/2000 | Takeuchi et al. |
| 7,023,736 | B2 | 4/2006 | Cernea et al. |
| 7,196,928 | B2 | 3/2007 | Chen |
| 7,196,931 | B2 | 3/2007 | Cernea et al. |
| 7,951,669 | B2 | 5/2011 | Harari et al. |
| 8,325,529 | B2 | 12/2012 | Huang et al. |

(Continued)

OTHER PUBLICATIONS

U.S. Appl. No. 61/939,095, filed Feb. 12, 2014, 52 pages.

(Continued)

*Primary Examiner* — Latanya N Crawford
(74) *Attorney, Agent, or Firm* — Davis Wright Tremaine LLP

(57) ABSTRACT

Air gaps are formed between bit lines by etching to remove sacrificial material from between bit lines. Bit lines are protected from etch damage. Sacrificial material may be selectively oxidized prior to deposition of bit line metal so that protective oxide lies along sides of bit lines during etch. Portions of protective material may be selectively formed on tops of bit lines prior to etching sacrificial material.

9 Claims, 9 Drawing Sheets

(56) References Cited

U.S. PATENT DOCUMENTS

| | | | |
|---|---|---|---|
| 8,778,749 B2 * | 7/2014 | Pachamuthu et al. | 438/201 |
| 2005/0169082 A1 | 8/2005 | Cernea | |
| 2006/0140007 A1 | 6/2006 | Cernea et al. | |
| 2006/0158947 A1 | 7/2006 | Chan et al. | |
| 2007/0052101 A1 | 3/2007 | Usami | |
| 2008/0254600 A1 | 10/2008 | Liu et al. | |
| 2008/0299766 A1 | 12/2008 | Omoto et al. | |
| 2010/0244255 A1 | 9/2010 | Lee | |
| 2011/0291281 A1 | 12/2011 | Huang | |
| 2012/0032344 A1 * | 2/2012 | Usami | 257/774 |
| 2012/0058639 A1 * | 3/2012 | Sim et al. | 438/666 |
| 2013/0214415 A1 | 8/2013 | Pachamuthu et al. | |
| 2013/0228934 A1 * | 9/2013 | Kim et al. | 257/774 |
| 2013/0309868 A1 * | 11/2013 | Cai et al. | 438/694 |
| 2014/0061926 A1 | 3/2014 | Han | |
| 2014/0097482 A1 | 4/2014 | Tokunaga et al. | |
| 2014/0112050 A1 | 4/2014 | Park | |
| 2014/0120692 A1 | 5/2014 | Purayath et al. | |

OTHER PUBLICATIONS

Chan et al., "A True Single-Transistor Oxide-Nitride-Oxide EEPROM Device," IEEE Electron Device Letters, vol. EDL-8, No. 3, Mar. 1987, pp. 93-95.

Nozaki et al., "A 1-Mb EEPROM with MONOS Memory Cell for Semiconductor Disk Application," IEEE Journal of Solid-State Circuits, vol. 26, No. 4, Apr. 1991, pp. 497-501.

Non-Final Office Action issued in U.S. Appl. No. 14/340,998, mailed on May 29, 2015, 12 pages.

Notice of Allowance issued in U.S. Appl. No. 14/340,998, mailed on Jan. 13, 2016, 7 pages.

* cited by examiner

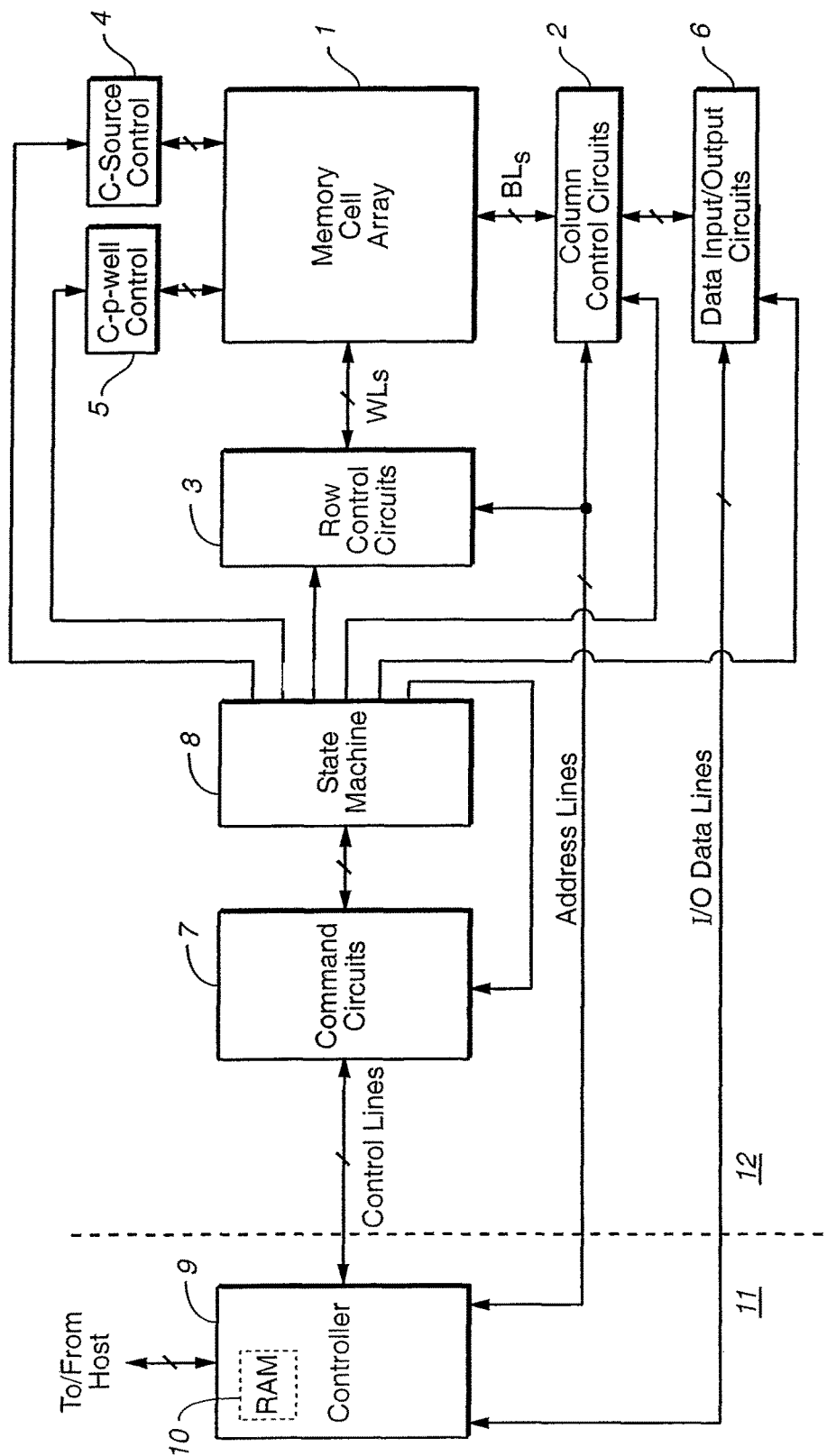
FIG._1
*(Prior Art)*

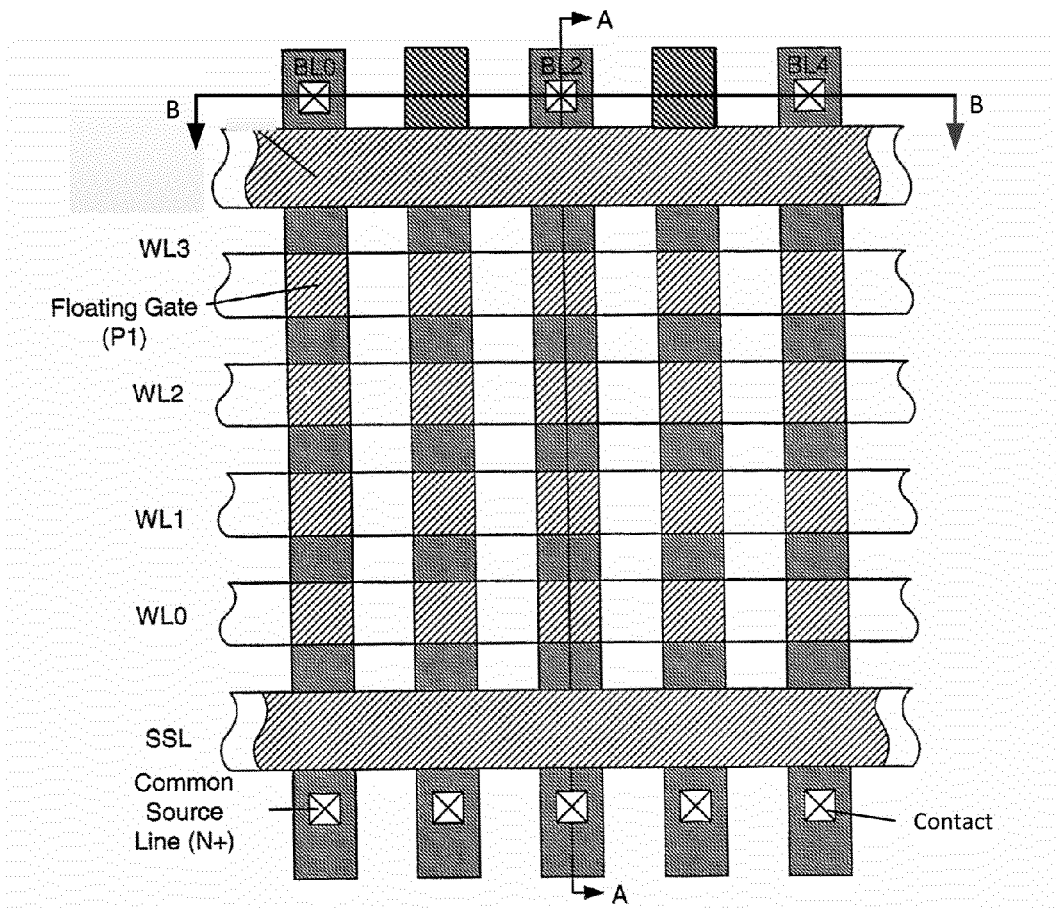
FIG._2A (PRIOR ART)
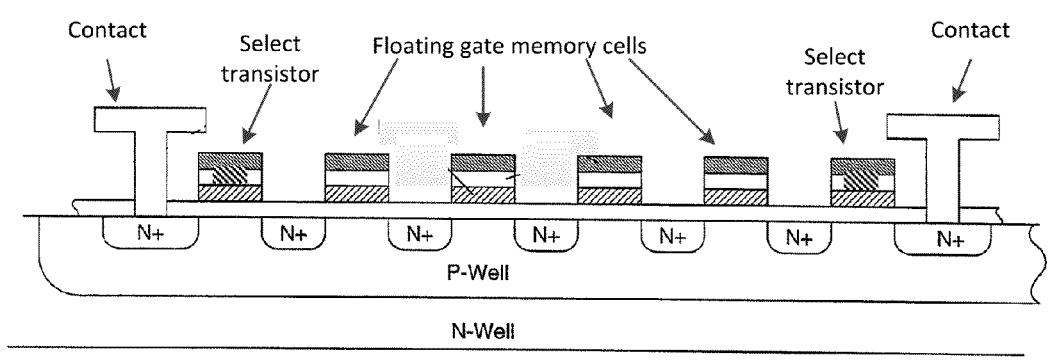
FIG._2B (PRIOR ART)
(Section A-A)

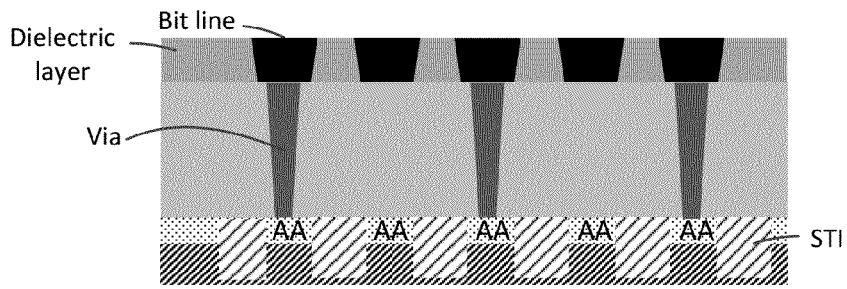
FIG. 2C (Prior Art)
(Section B-B)
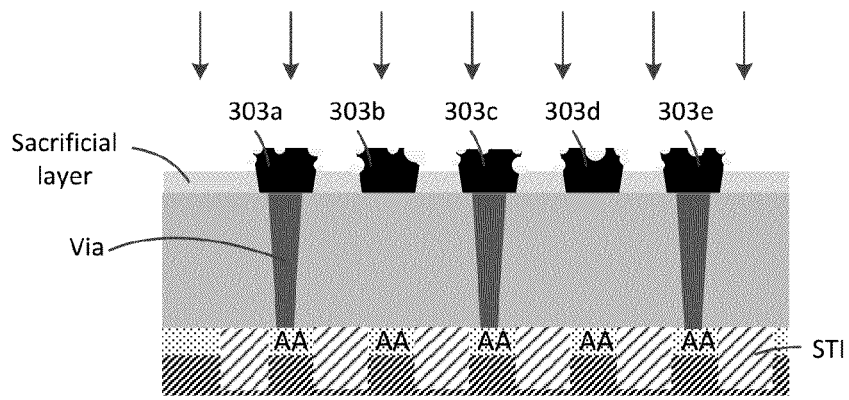
FIG. 3
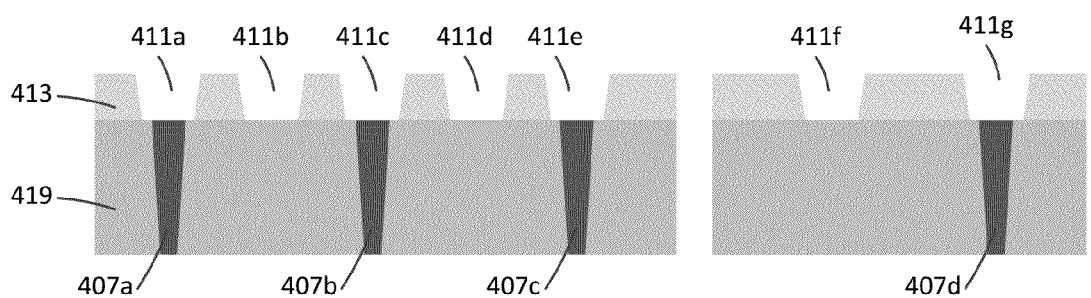
FIG. 4A  FIG. 4B

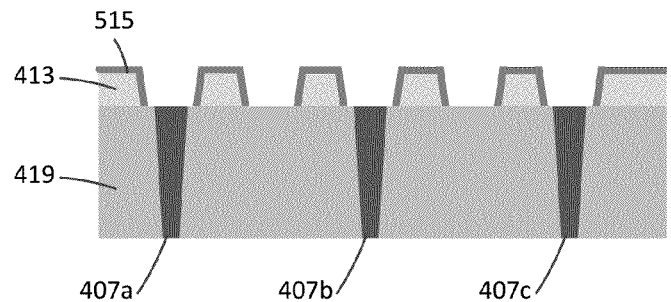
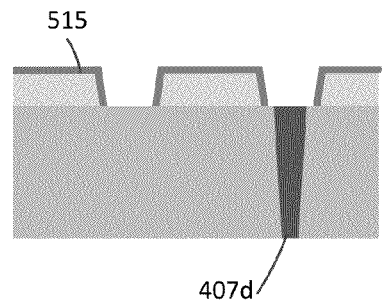
FIG. 5A  FIG. 5B
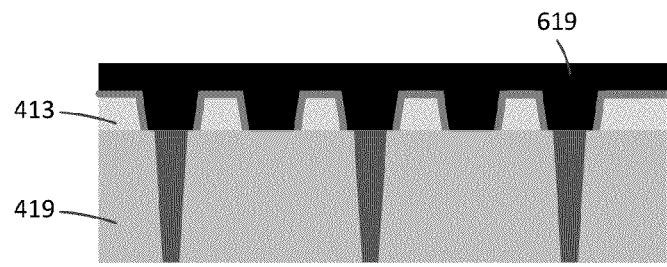
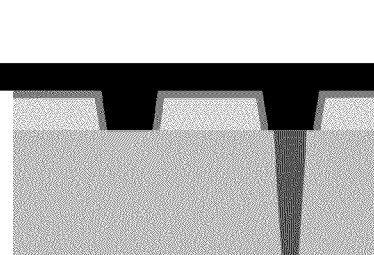
FIG. 6A  FIG. 6B
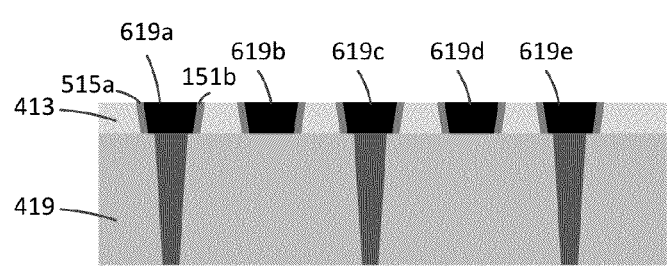
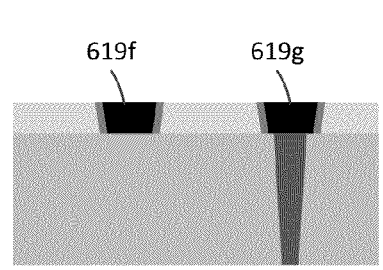
FIG. 7A  FIG. 7B

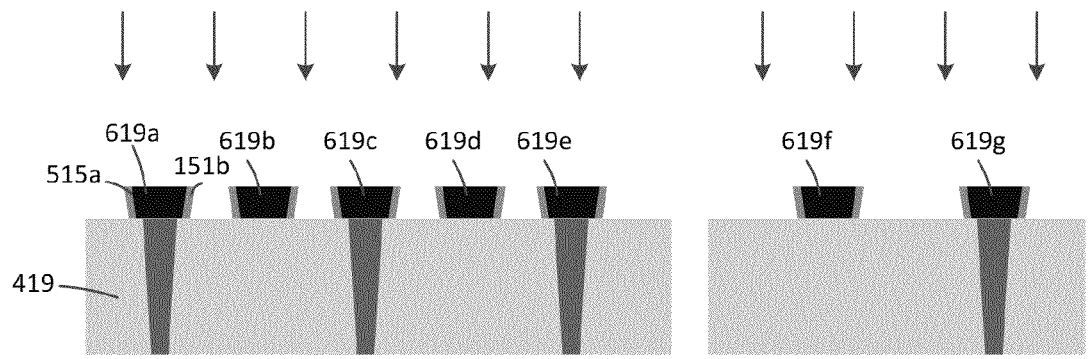
FIG. 8A          FIG. 8B
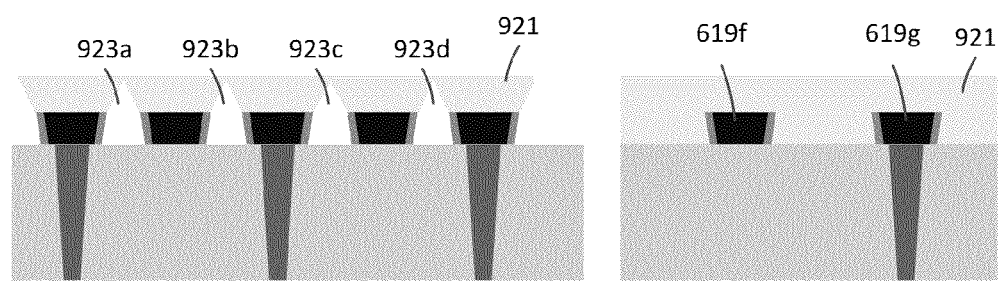
FIG. 9A          FIG. 9B

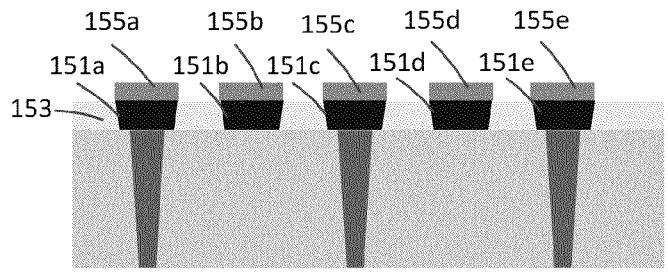
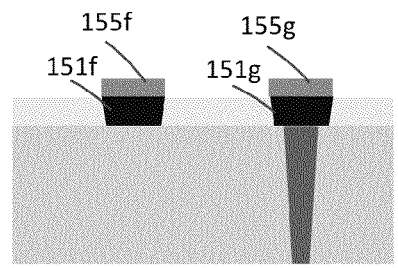
FIG. 11A  FIG. 11B
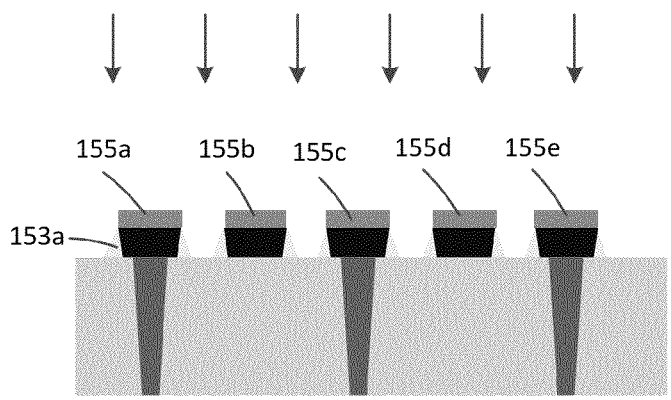
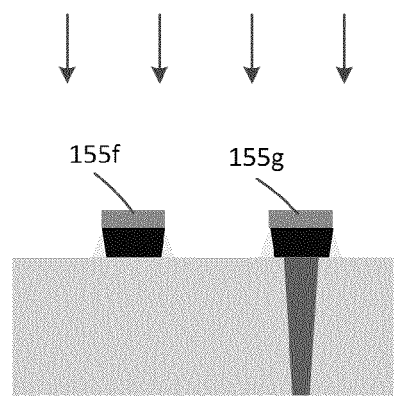
FIG. 12A  FIG. 12B
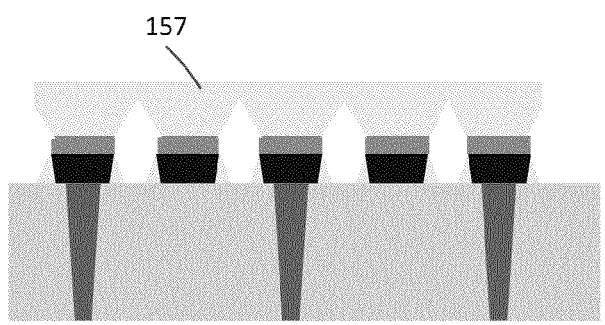
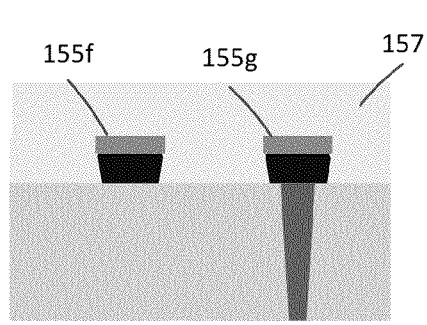
FIG. 13A  FIG. 13B

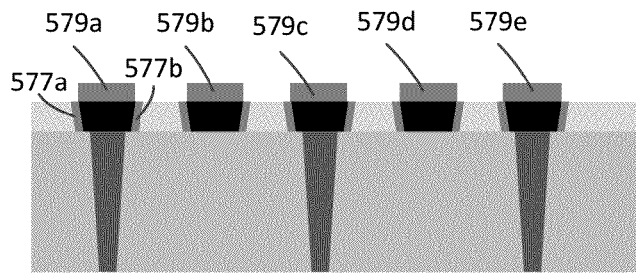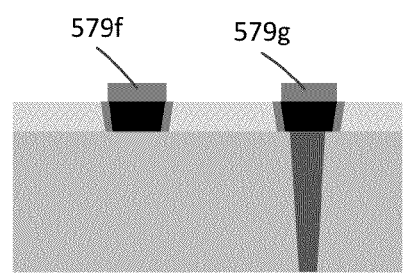
FIG. 15A  FIG. 15B
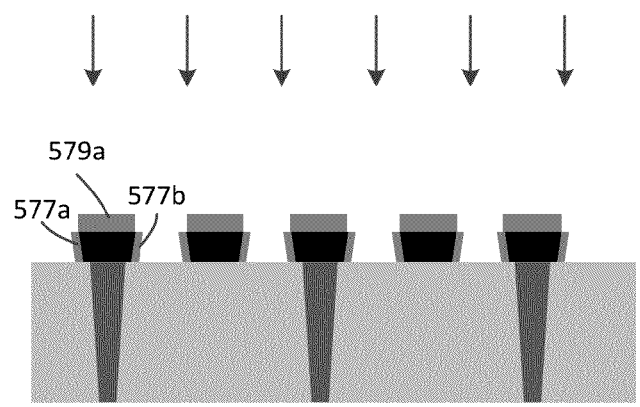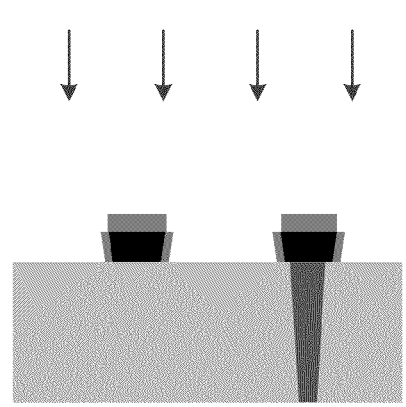
FIG. 16A  FIG. 16B

AIR GAP FORMATION BETWEEN BIT LINES WITH SIDE PROTECTION

CROSS REFERENCE TO RELATED APPLICATIONS

The present application claims the benefit of U.S. Provisional Patent Application No. 61/939,095, entitled, "Metal layer air gap for device performance improvement," filed on Feb. 12, 2014, which is hereby incorporated by reference in its entirety.

The present application is related to U.S. patent application entitled, "Air gap formation between bit lines with top protection," filed on the same date as the present application.

BACKGROUND OF THE INVENTION

This invention relates generally to non-volatile semiconductor memories of the flash memory type, their formation, structure and use.

There are many commercially successful non-volatile memory products being used today, particularly in the form of small form factor cards, USB drives, embedded memory, and Solid State Drives (SSDs) which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel. Examples of NAND memory cell array architectures and their operation are found in U.S. Pat. Nos. 5,570,315, 5,774,397, 6,046,935, and 7,951,669.

The top and bottom of the string connect to the bit line and a common source line respectively through select transistors (source select transistor and drain select transistor). Select transistors do not contain floating gates and are used to connect NAND strings to control circuits when they are to be accessed, and to isolate them when they are not being accessed.

NAND strings are generally connected by conductive lines in order to form arrays that may contain many NAND strings. At either end of a NAND string a contact area may be formed. This allows connection of the NAND string as part of the array. Metal contacts may be formed over contact areas to connect the contact areas (and thereby connect NAND strings) to conductive metal lines that extend over the memory array (e.g. bit lines). FIG. 2A shows bit line contacts BL0-BL4 and common source line contacts at either end of NAND strings. Contacts to contact areas may be formed by etching contact holes through a dielectric layer and then filling the holes with metal. Metal lines, such as bit lines, extend over the memory array and in peripheral areas in order to connect the memory array and various peripheral circuits. These metal lines may be close together (particularly in the memory array area where bit lines may be very close) which tends to make processing difficult and provides a risk of capacitive coupling. The characteristics of such lines (e.g. resistance) are important for good memory operation.

Thus, there is a need for a memory chip manufacturing process that forms uniform low resistance conductive lines, such as bit lines, in close proximity in an efficient manner.

SUMMARY OF THE INVENTION

According to an example of formation of a memory integrated circuit, air gaps are formed between bit lines to reduce bit line-to-bit line capacitance. Air gaps are formed by etching to remove sacrificial material from between bit lines, which has been found to cause damage to bit lines in some cases. Bit lines may be protected from etch damage during etching of sacrificial material to form air gaps. Sacrificial material may be selectively oxidized prior to deposition of bit line metal so that protective oxide lies along sides of bit lines during the etch. Portions of protective material may be selectively formed on tops of bit lines prior to etching sacrificial material. Thus, sides and/or top surfaces of bit lines, and other conductive lines, may be protected during etching of sacrificial material thereby reducing or eliminating etch damage to bit lines and allowing use of etch conditions that might otherwise be problematic.

An example of a method of forming bit lines of a nonvolatile memory includes: forming a sacrificial layer of a sacrificial material above a memory array; subsequently forming a plurality of elongated openings in the sacrificial layer; subsequently performing oxidation of exposed sacrificial material of the sacrificial layer in the plurality of elongated openings to form oxide portions; subsequently depositing a barrier layer over the oxidized portions; subsequently depositing a bit line metal over the barrier layer; subsequently removing excess bit line metal to form individual bit lines and to expose portions of sacrificial material between bit lines; and subsequently removing the portions of sacrificial material to form air gaps between bit lines.

The sacrificial material may comprise amorphous silicon and the oxide portions comprise silicon oxide. The sacrificial layer may be formed on a dielectric layer with metal vias, and the plurality of elongated openings may be aligned with upper surfaces of the metal vias. The oxidation of the exposed sacrificial material of the sacrificial layer may be performed using a selective oxidation process that does not significantly oxidize exposed upper surfaces of the metal vias or exposed surfaces of the dielectric layer. The sacrificial layer may be formed on an etch stop layer and the plurality of elongated openings in the sacrificial layer may be formed by etching through the sacrificial layer and stopping on the etch stop layer. The bit line metal may be copper or tungsten and the barrier layer may comprise at least one of: titanium, titanium nitride, titanium oxide, tungsten nitride, tantalum, or tantalum oxide. The oxidation of the exposed sacrificial material may provide an oxide thickness in the range of about 2 nanometers to 5 nanometers of oxide along sides of the plurality of openings in the sacrificial material. The sacrificial material may be removed using a selective etch that has a higher etch rate for the sacrificial material than for the oxide portions so that substantially all sacrificial material may be removed while the oxide portions remain substantially intact. Prior to removing the portions of sacrificial material, portions of protective material may be selectively formed on upper surfaces of the bit lines without forming the protective material on the portions of sacrificial material.

An example of a NAND flash memory includes: a plurality of bit lines extending over a memory array, the plurality of bit lines separated by air gaps; an individual bit line of the plurality of bit lines comprising: a conductive metal core; a barrier layer extending along a lower surface and sides of the conductive metal core; first protective sidewall along a first side of the bit line, the first protective sidewall lying between the barrier layer and a first air gap; and a second protective sidewall along a second side of the bit line, the second protective sidewall lying between the barrier layer and a second air gap.

The first and second protective sidewalls may be formed of silicon oxide. The individual bit line may connect to a plurality of metal vias that extend vertically to connect to conductors in the memory array. The conductive metal core may comprise copper or tungsten and the barrier layer comprises at least one of: titanium, titanium nitride, titanium oxide, tungsten nitride, tantalum, or tantalum oxide. The first and second sidewalls may have a thickness in the range of 2 nanometers to 5 nanometers. The individual bit line may include a portion of protective material extending over the conductive metal core.

An example of a method of forming bit lines of a nonvolatile memory includes: forming a sacrificial layer of a sacrificial material above a memory array; subsequently forming a plurality of elongated openings in the sacrificial layer; subsequently forming a plurality of bit lines in the plurality of elongated openings; subsequently selectively forming a protective material on exposed upper surfaces of the plurality of bit lines while leaving upper surfaces of sacrificial material portions exposed between bit lines; and subsequently etching the sacrificial material portions to form air gaps between bit lines, the protective material remaining in place throughout the etching of the sacrificial material portions.

The sacrificial material portions may be etched by a selective dry etch that etches the sacrificial material at a higher rate than the protective material. The sacrificial material portions may be etched by anisotropic etching while the protective material masks the upper surfaces of the plurality of bit lines. The anisotropic etching may leave residual sacrificial material along sides of the bit lines. The sacrificial material may comprise: undoped silicon oxide, fluorine doped silicon oxide, carbon doped silicon oxide, hydrogen doped silicon oxide, porous silicon oxide, silicon nitride, silicon oxynitride, a polymer, or silicon. The protective material may be a metal silicide that is formed by silicidation of bit line metal. The protective material may be copper silicide that is formed by silicidation of bit line copper, or the protective material is tungsten silicide that is formed by silicidation of bit line tungsten. The protective material may comprise tungsten that is deposited by selective Chemical Vapor Deposition (CVD) that provides substantially no tungsten deposition on the upper surfaces of the sacrificial material portions. The tungsten that is deposited by selective CVD may act as a nucleation layer for subsequent deposition of additional tungsten by electroless plating. The protective material may be cobalt tungsten phosphide that is selectively formed on copper. Prior to forming the plurality of bit lines in the plurality of elongated openings, exposed surfaces of the sacrificial layer may be oxidized to form oxide portions along sides of bit lines, and the sacrificial material portions may be etched using an etch that selectively etches the sacrificial material at a higher rate than the oxide portions so that substantially all of the sacrificial material is removed while the oxide portions remain.

An example of a NAND flash memory includes: a plurality of bit lines extending above a memory array, the plurality of bit lines separated by air gaps, an individual bit line of the plurality of bit lines including: a conductive metal core; a barrier layer; and a protective layer extending along an upper surface of the conductive metal core.

The conductive metal core may comprise copper and the protective layer comprises copper silicide. The conductive metal core may comprise tungsten and the protective layer may comprise tungsten silicide. The conductive metal core may comprise copper and the protective layer may comprise tungsten. The conductive metal core may comprise copper and the protective layer may comprise cobalt tungsten phosphide. The conductive metal core may comprise copper or tungsten and the protective layer may comprise silicon nitride. The individual bit line may further comprise silicon oxide sidewall portions extending along sides of the individual bit line between the barrier layer and the air gaps. Portions of residual sacrificial material may remain along sides of bit lines.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 1 is a block diagram of a prior art memory system.

FIG. 2A is a plan view of a prior art NAND array.

FIG. 2B shows a cross section of the NAND array of FIG. 2A.

FIG. 2C shows another cross section of the NAND array of FIG. 2A.

FIG. 3 illustrates an example of formation of air gaps between bit lines.

FIGS. 4A and 4B illustrate an example of a memory array area and peripheral area respectively at an intermediate stage of fabrication.

FIGS. 5A and 5B illustrate the integrated circuit of FIGS. 4A and 4B at a subsequent stage of fabrication after selective oxidation.

FIGS. 6A and 6B illustrate the integrated circuit of FIGS. 5A and 5B at a subsequent stage of fabrication after deposition of bit line metal.

FIGS. 7A and 7B illustrate the integrated circuit of FIGS. 6A and 6B at a subsequent stage of fabrication after planarization.

FIGS. 8A and 8B illustrate the integrated circuit of FIGS. 7A and 7B at a subsequent stage of fabrication during etch to remove sacrificial material between bit lines.

FIGS. 9A and 9B illustrate the integrated circuit of FIGS. 8A and 8B at a subsequent stage of fabrication after formation of a cap layer.

FIGS. 11A and 11B illustrate an example of a memory array area and peripheral area respectively at an intermediate stage of fabrication after selective formation of protective strips on upper surfaces of conductive lines.

FIGS. 12A and 12B illustrate the integrated circuit of FIGS. 11A and 11B at a subsequent stage of fabrication during anisotropic etching of sacrificial material.

FIGS. 13A and 13B illustrate the integrated circuit of FIGS. 12A and 12B at a subsequent stage of fabrication after formation of a cap layer.

FIGS. 15A and 15B illustrate an example of a memory array and peripheral area respectively at an intermediate stage of fabrication after selective oxidation of sacrificial material and selective formation of protective strips on conductive lines.

FIGS. 16A and 16B illustrate the integrated circuit of FIGS. 15A and 15B at a subsequent stage of fabrication during etching of sacrificial material with sides and upper surfaces of conductive lines protected.

DETAILED DESCRIPTION OF EXEMPLARY EMBODIMENTS

Memory System

Figure 10:
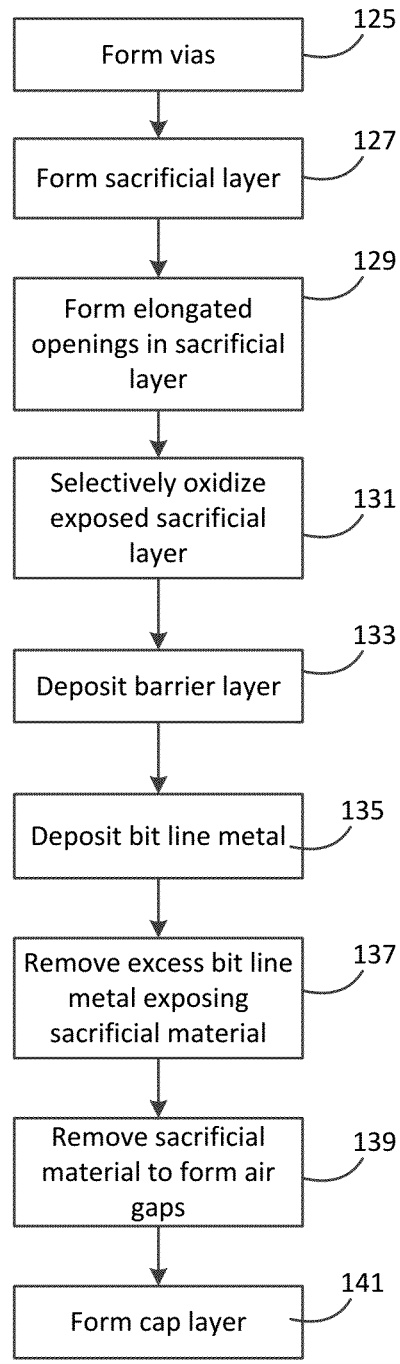
FIG. 10 illustrates an example of process steps used to form bit lines with protected sides.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of, non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

An example of a prior art memory system, which may be modified to include various aspects of the present invention, is illustrated by the block diagram of FIG. 1. A planar memory cell array 1 including a plurality of memory cells is controlled by a column control circuit 2, a row control circuit 3, a c-source control circuit 4 and a c-p-well control circuit 5. The memory cell array 1 is, in this example, of the NAND type similar to that described above in the Background and in references incorporated therein by reference. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. Several card implementations are described, for example, in U.S. Pat. No. 5,887,145. The memory system of FIG. 1 may also be used in a Solid State Drive (SSD) or similar unit that provides mass data storage in a tablet, laptop computer, or similar device.

FIGS. 2A-2C show different views of a prior art NAND flash memory. In particular, FIG. 2A shows a plan view of a portion of such a memory array including bit lines and word lines (this is a simplified structure with a small number of word lines and bit lines). FIG. 2B shows a cross section along A-A (along a NAND string) showing individual memory cells that are connected in series. Contacts, or vias, are formed at either end to connect the NAND strings in the memory array to conductive lines (e.g. connecting to bit lines at one end and to a common source line at the other end). Such a via may be formed of metal that is deposited into a contact hole that is formed in a dielectric layer. FIG. 2C shows a cross section along B-B of FIG. 2A. This view shows metal vias extending down through contact holes in a dielectric layer to make contact with active areas ("AA") in the substrate (i.e. with N+ areas of FIG. 2B). STI regions are located between active areas of different strings to electrically isolate an individual NAND string from its neighbors. Bit lines extend over the memory array in a direction perpendicular to the cross section shown. Alternating bit lines are connected to vias in the cross section shown. (It will be understood that other vias, that are not visible in the cross section shown, connect the remaining bit lines to other active areas). In this arrangement, locations of vias alternate so that there is more space between vias and thus less risk of contact between vias. Other arrangements are also possible.

As memories become smaller, the spacing between bit lines tends to diminish. Accordingly, capacitive coupling between bit lines tends to increase as technology progresses to ever-smaller dimensions. FIG. 2C shows bit lines formed in a dielectric material. For example, copper bit lines may be formed by a damascene process in which elongated openings, or trenches, are formed in the dielectric layer and then copper is deposited to fill the trenches. When excess copper is removed (e.g. by Chemical Mechanical Polishing, CMP) copper lines remain. A suitable dielectric may be chosen to keep bit line-to-bit line capacitance low.

One way to reduce bit line-to-bit line coupling is to provide an air gap between neighboring bit lines. Thus, rather than maintain dielectric portions between bit lines, the bit lines are formed in a sacrificial layer which is then removed to leave air gaps between bit lines. Examples of such bit lines are described in U.S. Provisional Patent Application No. 61/939,095, entitled, "Metal layer air gap for device performance improvement," filed on Feb. 12, 2014, which is hereby incorporated by reference in its entirety.

Removing sacrificial material between bit lines generally requires some form of etching which may expose bit lines to etch related damage. While a suitable combination of sacrificial material and etch chemistry may be chosen so that sacrificial material is etched at a higher rate than bit line metal, some etching of bit line metal may occur and bit lines may be damaged accordingly.

FIG. 3 shows an example of an etch step that removes sacrificial material to form air gaps between bit lines 303a-e. While removing sacrificial material the etch also removes some bit line metal and thus damages bit lines. In some areas, bit lines may be etched through, which may result in a broken bit line. In other areas, cross sectional area of bit lines may be reduced leading to high resistance which may result in poor operation and may lead to failure over time. Conductive lines other than bit lines may also be affected. For example, conductive lines in the periphery of a memory array may connect peripheral circuits and may also be affected. It is generally desirable to maintain conductive lines, including bit lines, intact throughout removal of sacrificial material to form air gaps.

Aspects of the present invention are directed to protecting conductive lines, such as bit lines, during etching to remove sacrificial material. For example, some physical protection may be formed on the top and/or side surfaces of bit lines prior to removal of sacrificial material. This physical protection may remain in place, at least during etching of sacrificial material, so the bit line metal (and/or barrier layer material) is not directly exposed to etching conditions and therefore remains undamaged by the etch step used to etch sacrificial material.

Side Protection

FIG. 4A shows a cross section of a portion of NAND flash memory integrated circuit (IC), at an intermediate stage of fabrication, where bit lines are to be formed over a memory array. Vias 407a-c extend up from contact areas (not shown) through a dielectric layer 419. Elongated openings (trenches) 411a-e are formed in the sacrificial layer 413 and are aligned with vias so that bit lines are formed in physical contact with vias 407a-e. Elongated openings may be formed by patterning and etching. In some examples, etching may stop on the dielectric layer 409 using a selective etch that stops at the dielectric layer surface. In other examples, an etch-stop layer is provided between the dielectric layer 419 and the sacrificial layer 413. The elongated openings may be formed by etching until the etch-stop layer is reached.

FIG. 4B shows a cross section of a peripheral portion of the NAND flash memory integrated circuit of FIG. 4A at the same intermediate stage of fabrication. It can be seen that the spacing between elongated openings 411f-g is wider than in the memory array area. In general, conductive lines in peripheral areas may be more widely spaced than in the memory array area. Aspects of the present invention are not limited to any particular spacing between conductive lines.

According to an aspect of the present invention, selective oxidation of sacrificial material may be performed prior to deposition of bit line metal (and barrier layer) and the resulting oxide may subsequently provide protection for conductive lines during etching of the sacrificial material.

FIGS. 5A and 5B show the same portions of the IC of FIGS. 4A and 4B at a subsequent stage. In particular, FIGS. 5A and 5B show the results of selective oxidation of the sacrificial layer 413. This results in a layer of oxide 515 overlying all exposed surfaces of the sacrificial material including sides of the elongated openings. However, underlying dielectric 419 (or etch-stop layer) may not be oxidized and exposed areas of vias 407a-d are not oxidized by this oxidation step. For example, where the sacrificial material is amorphous silicon, a suitable selective oxidation step may use hydrogen and/or oxygen to selectively form silicon oxide on exposed silicon surfaces without oxidizing exposed metal of vias (e.g. tungsten). According to an example, selective oxidation is used to form an oxide in the range of 2-5 nanometers thick. Other thicknesses may also be selected depending on dimensions and requirements.

FIGS. 6A and 6B show the same portions of the IC of FIGS. 5A and 5B after deposition of a barrier layer and bit line metal 619. (The barrier layer is not separately shown in the drawings.) Any suitable barrier layer may be used including compound layers including one or more individual layers of materials such as titanium, titanium nitride, titanium oxide, tungsten nitride, tantalum, tantalum oxide. The bit line metal may be copper, tungsten, or other metal that is suitable for forming low resistance conductive lines.

FIGS. 7A and 7B show the same portions of the IC of FIGS. 6A and 6B after removal of excess bit line metal 619 to form individual conductive lines 619a-g. For example, bit line metal may be subject to planarization by Chemical Mechanical Polishing (CMP) to remove bit line metal that is not in elongated openings. Planarization also removes oxide 515 that lies between elongated openings thus exposing sacrificial material 413 in these areas. Oxide remains along sides of elongated openings between bit line metal and sacrificial material (e.g. oxide portions 515a, 515b along sides of bit line 619a). While the term "bit line metal" is used here, it will be understood that other conductive lines may be formed of this metal, e.g. conductive lines 619f, 619g.

FIGS. 8A and 8B show the same portions of the IC of FIGS. 7A and 7B during an etch step to remove sacrificial material 413. It can be seen that oxide portions (e.g. oxide portions 515a-b) remain in place along sides of conductive lines in this example. Thus, as sacrificial material 413 is removed, rather than exposing the sides of conductive lines 619a-g, the etch exposes oxide portions which protect the sides of the conductive lines. A suitable etch may be chosen so that sacrificial material is removed selectively (i.e. the etch rate for sacrificial material is higher than the etch rate for oxide). Where amorphous silicon is used as the sacrificial material and oxide portions are formed of silicon oxide a suitable selective etch is a wet etch using trimethyl-2 hydroxyethyl ammonium hydroxide (TMY).

FIGS. 9A and 9B show the same portions of the IC of FIGS. 8A and 8B after formation of a cap layer 921. In particular, it can be seen that the cap layer 921 encloses air gaps 923a-d between bit lines, thus sealing air gaps 923a-d. Oxide portions remain in place while the cap layer is formed and remain in the finished product. FIG. 9B shows cap layer 921 extending between conductive lines 619f, 619g (without an air gap) in the periphery where the spacing between conductive lines is larger. This may be acceptable in the periphery because capacitive coupling is reduced by geometry of lines and the larger spacing between lines so that an air gap is not required.

FIG. 10 illustrates an example of certain process steps that may be used to foul' conductive lines and air gaps without damaging the conductive lines. Vias are formed in a dielectric layer over a substrate 125. Subsequently, a layer of sacrificial material is formed over the dielectric layer and vias 127. Elongated openings (trenches) are then formed in the sacrificial layer at locations where conductive lines are to be formed 129. A selective oxidation step then oxidizes exposed sacrificial material, including sides of the elongated openings 131. A barrier layer (which may be a compound layer, or multi-layer structure) is then deposited 133 and bit line metal is deposited over the barrier layer 135. Subsequently, excess bit line metal is removed to form separate bit lines (and other conductive lines) and to expose sacrificial material between conductive lines 137. Subsequently, a selective etch step is performed 139 to remove sacrificial material, while leaving oxide portions in place to protect sides of bit lines. Subsequently, a cap layer is formed 141 to cover air gaps between bit lines.

Top Protection

While the example above shows how sides of bit lines may be protected, such bit lines may still experience damage to their top surfaces in some cases. According to an example, bit lines are formed by depositing bit line metal over a sacrificial layer that has elongated openings and then removing the excess bit line metal. After removal of excess bit line metal and exposure of sacrificial material between bit lines, a protective material is selectively formed on upper surfaces of bit lines (and other conductive lines). The resulting strips of protective material then remain in place during an etch step to remove sacrificial material. In this way the protective material protects upper surfaces of the bit lines from damage during this etch step.

FIGS. 11A and 11B show bit lines 151a-e in the memory array area and conductive lines 151f-g in the peripheral area respectively at an intermediate stage of fabrication. In particular, individual bit lines are formed in a sacrificial layer 153 at this stage. In addition, portions of protective material (protective strips) 155a-g are formed on conductive lines 151a-g. It will be understood that a variety of processes exist for selective formation of such protective material and that the choice of material and process depend on a number of factors. For example, the selectively-formed protective material may be a silicide formed by silicidation of bit line metal (e.g. copper silicide formed on copper bit lines, or tungsten silicide formed on tungsten bit lines). Selective silicidation may be achieved by any suitable process, e.g. using silane (SiH4) at an elevated temperature (e.g. 400 C). The protective material may be selectively deposited tungsten, e.g. deposited by selective Chemical Vapor Deposition (CVD). In some cases, selective CVD may form entire protective strips. In other cases, selective CVD may selectively form a seed layer that acts as a nucleation layer for subsequent electroless plating. In another example, the protective layer may be cobalt tungsten phosphide that is selectively formed on copper (e.g. by CVD, or otherwise). It will be understood that aspects of the invention are not limited to any particular protective materials, or to the examples provided here.

FIGS. 12A and 12B show the IC of FIGS. 11A and 11B during a subsequent etch step to etch sacrificial material 153. In this example, an anisotropic etch is used (e.g. Reactive Ion Etching, or RIE). In this way, the protective strips 155a-g protect the upper surfaces of conductive lines and the anisotropic etching is directed downwards so that sides of bit lines are not exposed to aggressive etch conditions. In some cases, protective strips may extend somewhat wider than bit lines to form an overhang that provides a protected area along a side of a bit line. Also, bit lines formed in trenches tend to get narrower as they go down so that there may be an overhang even if protective strips do not extend beyond bit lines. Thus, protective strips 151a-g may provide some protection to sides of conductive lines during anisotropic etching (in addition to protecting upper surfaces). As a result, some sacrificial material (e.g. sacrificial material portion 153a) may remain along sides of bit lines under appropriate anisotropic etching conditions. This sacrificial material may provide some protection for sides of bit lines.

In this example, sacrificial material is not oxidized prior to bit line formation. A range of different sacrificial materials may be used. Various forms of silicon oxide may be used. The term "silicon oxide" is generally used here rather than "silicon dioxide" because the ratio of oxygen to silicon may not be exactly stoichiometric ratio of 2:1. The term "silicon oxide" will be understood to include stoichiometric silicon dioxide ($SiO_2$) and similar materials formed of silicon and oxygen in different ratios, with or without additional elements or dopants. For example, silicon oxide may be doped with fluorine, carbon, hydrogen or other dopants. Silicon oxide (doped or undoped) may be porous (i.e. containing air-filled holes or pores so that it is less dense). Silicon nitride, or silicon oxynitride may also be used. Also various forms of silicon (including amorphous silicon, polysilicon, doped or undoped) may be used.

FIGS. 13A and 13B show the IC of FIGS. 12A and 12B after formation of a cap layer 157 that covers air gaps. Protective strips remain in place during formation of the cap layer and thus are present in the finished product. Cap layer material extends between conductive lines in the periphery as before.

Figure 14:
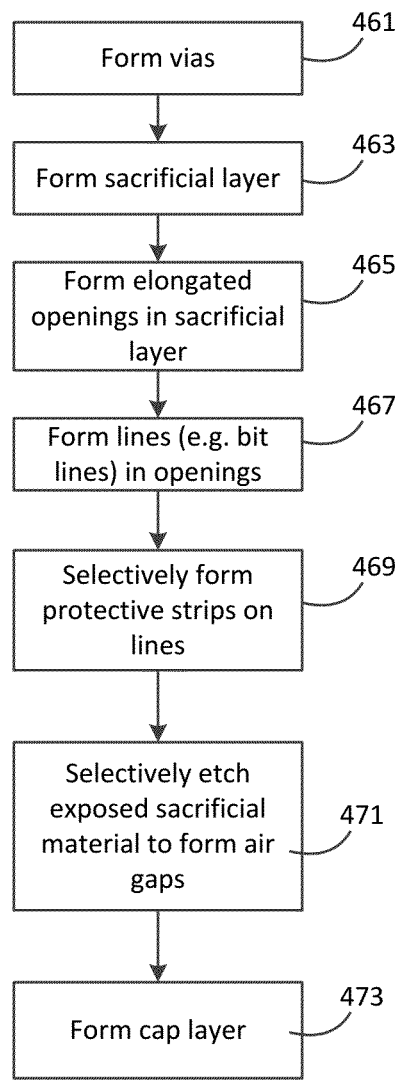
FIG. 14 illustrates an example of process steps used to form bit lines with protected upper surfaces.

FIG. 14 illustrates process steps according to an example. Vias are formed in a dielectric layer 461 and then a sacrificial layer is formed over the dielectric layer 463. Then elongated openings are formed in the sacrificial layer 465 at locations where conductive lines are to be formed and conductive lines are formed in the openings 467. Subsequently, protective material is selectively formed on the conductive lines as protective strips 469. A selective etch step (which may be anisotropic) is then performed to remove sacrificial material from between bit lines to form air gaps 471. This is done while the protective strips remain in place to protect the upper surfaces of bit lines. Then a cap layer is formed 473.

Combined Side and Top Protection

Aspects of the present invention may combine side and top protection so that portions of protective material cover both the side and top surfaces of conductive lines during etching of sacrificial material.

FIGS. 15A and 15B show conductive lines in a memory array and periphery respectively at an intermediate stage of fabrication. Selective oxidation of the sacrificial material, performed prior to deposition of bit line metal (and barrier layer) provides protective oxide portions along sides of conductive lines as previously described with respect to FIGS. 4-9 (e.g. protective oxide portions 577a-b on sides of bit line 575a). In addition, selective formation of protective strips 579a-g on top surfaces of conductive lines covers upper surfaces as described with respect to FIGS. 11-13.

FIGS. 16A and 16B show the integrated circuit of 15A and 15B during a subsequent etch step to remove sacrificial material. It can be seen that both side surfaces and top surfaces of conductive lines are protected during this etch step and are not directly exposed to etching conditions. Top surfaces are protected by protective strips (e.g. protective strip 579a) while side surfaces are protected by oxide portions (e.g. oxide portions 577a-b). This protection, which leaves no bit line metal exposed, may allow various etch conditions to be used that might not otherwise be used (e.g. etch conditions that would be damaging to bit line metal if it was directly exposed).

It will be understood that the examples provided above are for illustration of aspects of the present invention and are not limiting. For example, a range of different sacrificial materials may be used with different etch chemistries. Different selectively-formed protective materials may be chosen according to factors including bit line material and etch chemistry. While the above examples maintain protective material during and after etching of sacrificial material, in some cases it may be desirable to remove the protective material after etching sacrificial material, e.g. using an etch that does not damage bit lines.

CONCLUSION

Although the various aspects of the present invention have been described with respect to exemplary embodiments thereof, it will be understood that the present invention is entitled to protection within the full scope of the appended claims. Furthermore, although the present invention teaches the method for implementation with respect to particular prior art structures, it will be understood that the present invention is entitled to protection when implemented in memory arrays with architectures than those described.

It is claimed:

1. A method of forming bit lines of a nonvolatile memory comprising:

forming a sacrificial layer of a sacrificial material on a dielectric layer with metal vias above a memory array;

subsequently forming a plurality of elongated openings in the sacrificial layer, the plurality of elongated openings aligned with upper surfaces of the metal vias;

subsequently performing selective oxidation of exposed sacrificial material of the sacrificial layer in the plurality of elongated openings to form first oxide portions along sides of the elongated openings, and of exposed sacrificial material of the sacrificial layer between the plurality of elongated openings to form second oxide portions, without significantly oxidizing exposed upper surfaces of the metal vias or exposed surfaces of the dielectric layer;

subsequently depositing a barrier layer over the first and second oxidized portions;

subsequently depositing a bit line metal over the barrier layer;

subsequently removing excess bit line metal and the second oxide portions to form individual bit lines and to expose portions of sacrificial material between bit lines; and subsequently removing the portions of sacrificial material to form air gaps between bit lines.

2. The method of claim 1 wherein the sacrificial material comprises amorphous silicon and the oxide portions comprise silicon dioxide.

3. The method of claim 1 wherein the sacrificial layer is formed on an etch stop layer and wherein the plurality of elongated openings in the sacrificial layer are formed by etching through the sacrificial layer and stopping on the etch stop layer.

4. The method of claim 1 wherein the bit line metal is copper or tungsten and the barrier layer comprises at least one of: titanium, titanium nitride, titanium oxide, tantalum, or tantalum oxide.

5. The method of claim 1 wherein the oxidation of the exposed sacrificial material provides an oxide thickness in the range of about 2 nanometers to 5 nanometers of oxide along sides of the plurality of openings in the sacrificial material.

6. The method of claim 1 wherein the sacrificial material is removed using a selective etch that has a higher etch rate for the sacrificial material than for the oxide portions so that substantially all sacrificial material is removed while the oxide portions remain substantially intact.

7. The method of claim 1 further comprising: prior to removing the portions of sacrificial material, selectively forming portions of protective material on upper surfaces of the bit lines without forming the protective material on the portions of sacrificial material.

8. The method of claim 7 wherein selectively forming the portions of protective material on the upper surfaces of the bit lines includes selective Chemical Vapor Deposition (CVD) of a nucleation layer and subsequent deposition of an additional layer by electroless plating on the nucleation layer.

9. The method of claim 8 wherein the nucleation layer and the additional layer are formed of tungsten.

* * * * *